(12) United States Patent
Yen et al.

(10) Patent No.: US 8,766,303 B2
(45) Date of Patent: Jul. 1, 2014

(54) LIGHT-EMITTING DIODE WITH A MIRROR PROTECTION LAYER

(75) Inventors: Wei-Yu Yen, Taichung (TW); Li-Ping Chou, Taichung (TW); Fu-Bang Chen, Taichung (TW); Chih-Sung Chang, Taichung (TW)

(73) Assignee: High Power Opto. Inc., Taichung (TW)

( * ) Notice: Subject to any disclaimer, the term of this patent is extended or adjusted under 35 U.S.C. 154(b) by 147 days.

(21) Appl. No.: 13/601,161

(22) Filed: Aug. 31, 2012

(65) Prior Publication Data

US 2014/0061695 A1 Mar. 6, 2014

(51) Int. Cl.
*H01L 33/60* (2010.01)
(52) U.S. Cl.
USPC .................................... 257/98; 257/E33.072
(58) Field of Classification Search
CPC ...... H01L 33/10; H01L 33/60; H01L 51/5271
USPC ............................................. 257/98, E33.072
See application file for complete search history.

(56) References Cited

U.S. PATENT DOCUMENTS

| 7,417,261 | B2 * | 8/2008 | Seo et al. | 257/98 |
| 8,232,571 | B2 * | 7/2012 | Seo | 257/98 |
| 2012/0256210 | A1 * | 10/2012 | Moon et al. | 257/94 |

* cited by examiner

*Primary Examiner* — Matthew W Such
*Assistant Examiner* — David Spalla
(74) *Attorney, Agent, or Firm* — Muncy, Geissler, Olds & Lowe, P.C.

(57) ABSTRACT

A light-emitting diode (LED) with a mirror protection layer includes sequentially stacked an N-type electrode, an N-type semiconductor layer, a light-emitting layer, a P-type semiconductor layer, a metal mirror layer, a protection layer, a buffer layer, a binding layer, a permanent substrate, and a P-type electrode. The protection layer is made of metal oxide, and has a hollow frame for covering or supporting edges of the metal mirror layer.

24 Claims, 9 Drawing Sheets

LIGHT-EMITTING DIODE WITH A MIRROR PROTECTION LAYER

FIELD OF THE INVENTION

The present invention relates to a light-emitting diode (LED), and particularly to a structure for increasing light extraction efficiency of an LED.

BACKGROUND OF THE INVENTION

A light-emitting diode (LED) is principally formed by a semiconductor material of multiple stacked epitaxial layers. For example, a blue-light LED is mainly consisted of gallium nitride-based (GaN-based) epitaxial thin films.

Referring to FIG. 1, a conventional vertical LED includes a sandwich structure formed by an N-type semiconductor layer 1, a light-emitting layer 2 and a P-type semiconductor layer 3. Below the P-type semiconductor layer 3, a mirror layer 4, a buffer layer 5, a binding layer 6, a silicon substrate 7 and a P-type electrode 8 are disposed in sequence. A surface of the N-type semiconductor layer 1 is processed by a roughening treatment for increasing light extraction efficiency. An N-type electrode 9 is further provided. By applying a voltage to the N-type electrode 9 and the P-type electrode 8, the N-type semiconductor layer 1 is enabled to provide electrons and the P-type semiconductor layer 3 is enabled to provide holes. Light is produced by the electrons and holes combining at the light-emitting layer 2.

In a conventional solution for increasing light extraction efficiency of an LED, light emitted by the light-emitting layer 2 is reflected by the mirror layer 4. Thus, the mirror layer 4 is made of a high-reflectivity material such as a silver/titanium tungsten/platinum alloy coating, a silver/titanium/platinum alloy coating, a silver/titanium tungsten/nickel alloy coating and a silver/nickel alloy coating. Through the mirror layer 4 having the properties of high reflectivity and high thermal stability due to the above materials, light can be reflected at a maximum angle to increase light extraction efficiency and provide stable electrical characteristic.

After forming the mirror layer 4 below the P-type semiconductor 3 of the LED, the buffer layer 5 and the binding layer 6, the silicon substrate 7 and the P-type electrode 8 are yet to be formed, inferring that several semiconductor processes need to be performed in order to achieve a complete LED structure. However, the silver in the mirror layer 4 is prone to oxidation in the subsequent processes, and it may reduce the reflectivity of the mirror layer 4 to further decrease light extraction efficiency of the LED. Further, high temperature produced in high-current operations may also lead to metal deterioration, which similarly reduces the reflectivity of the mirror layer 4 to decrease light extraction efficiency of the LED.

SUMMARY OF THE INVENTION

Therefore, the primary object of the present invention is to propose a light-emitting diode (LED) with a mirror protection layer for increasing light extraction efficiency of the LED.

An LED with a mirror protection layer provided by the present invention comprises an N-type electrode, an N-type semiconductor layer, a light-emitting layer, a P-type semiconductor layer, a metal mirror layer, a protective adhesion layer, a protection layer, a buffer layer, a binding layer, a permanent substrate and a P-type electrode. The N-type electrode is formed at one side of the N-type semiconductor, the light-emitting layer is formed at one other side of the N-type semiconductor layer away from the N-type electrode, the P-type semiconductor is formed at one side of the light-emitting layer away from the N-type semiconductor layer.

In an embodiment, the metal mirror layer is formed at one side of the P-type semiconductor layer away from the light-emitting layer. The protective adhesion layer is formed at one side of the metal mirror layer away from the P-type semiconductor layer, and has a hollow frame. The hollow frame masks edges of the metal mirror layer, and extends inwards by 10 to 50 µm. The protection layer is formed at one other side of the mirror layer away from the P-type semiconductor layer. The protection layer is made of metal oxide and has the hollow frame same as the protective adhesion layer. The buffer layer is formed at one side of the protection layer away from the metal mirror layer, and passes through the frame to contact with the metal mirror layer. The binding layer is formed at one side of the buffer layer away from the protection layer, the permanent substrate is formed at one side of the binding layer away from the protection layer, and the P-type electrode is formed at one side of the permanent substrate away from the binding layer.

In an alternative embodiment, the protective adhesion layer is formed at one side of the P-type semiconductor layer away from the light-emitting layer, and has a hallow frame. The protection layer is formed at one side of the protective adhesion layer away from the P-type semiconductor layer. The protection layer is made of metal oxide, and has the hollow frame. The metal mirror layer passes through the frame to form at one side of the P-type semiconductor layer away from the light-emitting diode, so as to allow the hollow frame of the protective adhesion layer and the protection layer to support the edges of the metal mirror layer. Further, the metal mirror layer extends from edges of the protection layer towards a center thereof by 10 to 50 µm. The buffer layer is formed at one side of the metal mirror layer away from the protection layer, and jointly encases the metal mirror layer with the protective adhesion layer and the protection layer at the edges of metal mirror layer. The binding layer is formed at one side of the buffer layer away from the protection layer, the permanent substrate is formed at one side of the binding layer away from the protection layer, and the P-type electrode is formed at one side of the permanent substrate away from the binding layer.

Accordingly, in the present invention, the metal mirror layer is protected through annularly masking the metal mirror layer by the protection layer, or masking the metal mirror layer jointly by the protection layer and the buffer layer. Therefore, the metal mirror layer is prevented from not only oxidation in subsequent processes but also metal precipitation in high-current operations, thereby maintaining the high reflectivity of the metal mirror layer, i.e., light emitted by the light-emitting layer can be thoroughly reflected to increase light extraction efficiency and electrical stability of the LED.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
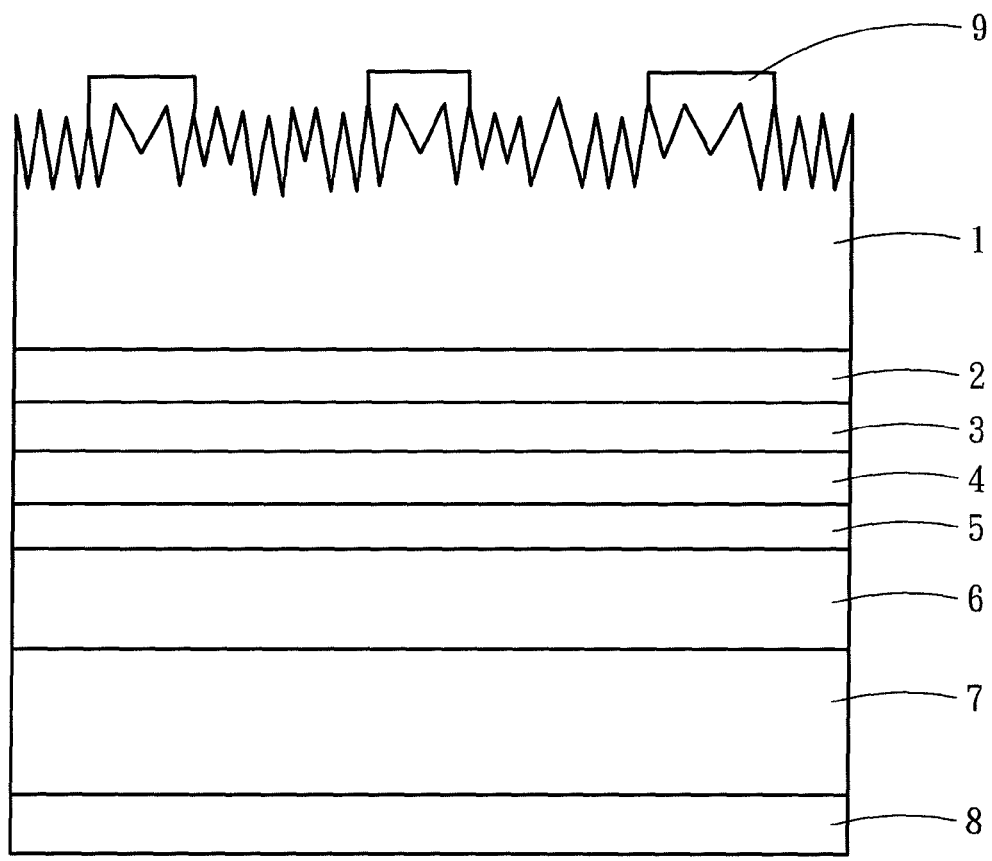
FIG. 1 is a structural diagram of a conventional LED.
Figure 2:
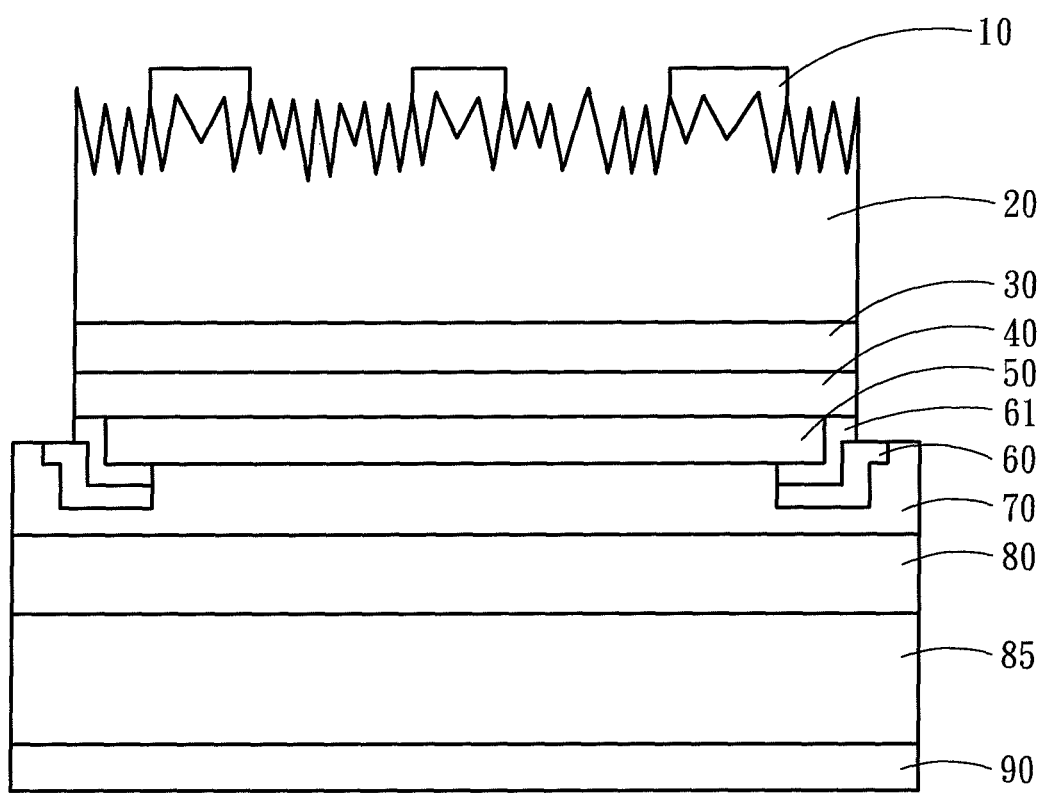
FIG. 2 is a structural diagram of an LED according to one embodiment of the present invention.
Figure 3:
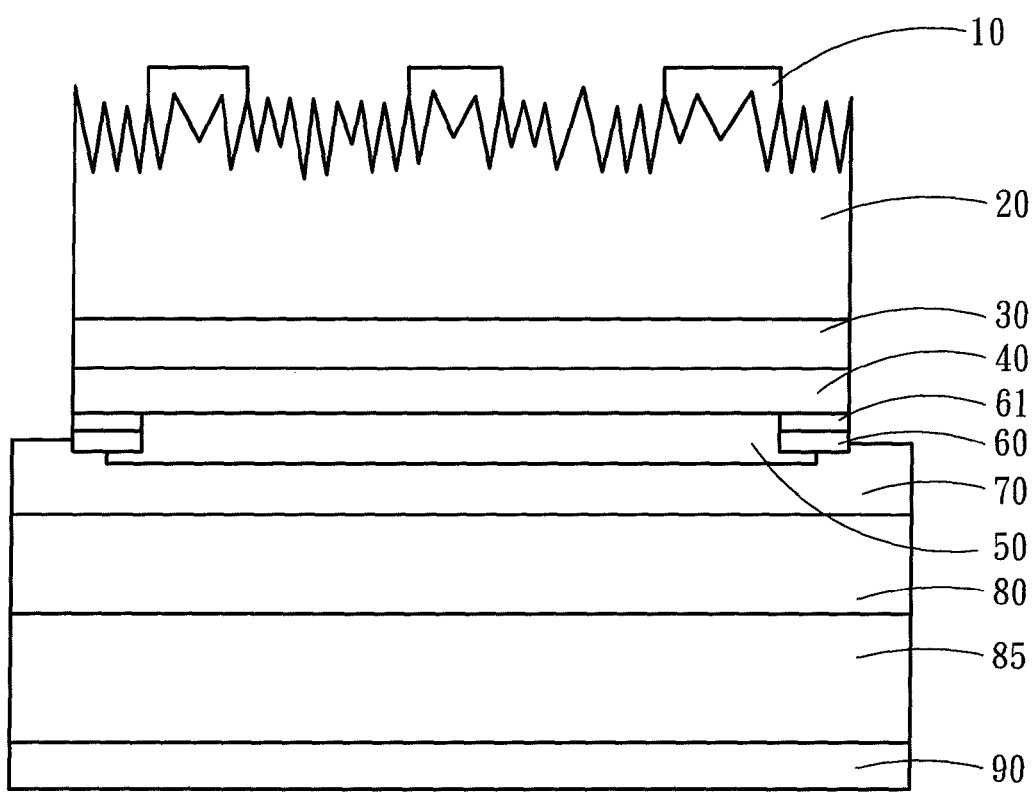
FIG. 3 is a structural diagram of an LED according to another embodiment of the present invention.

Referring to FIGS. 2 and 3, an LED with a mirror protection layer according to one embodiment of the present invention comprises an N-type electrode 10, an N-type semiconductor layer 20, a light-emitting layer 30, a P-type semiconductor layer 40, a metal mirror layer 50, a protection layer 60, a protective adhesion layer 61, a buffer layer 70, a binding layer 80, a permanent substrate 85, and a P-type electrode 90.

The N-type electrode 10 is formed at one side of the N-type semiconductor layer 20, the light-emitting diode 30 is formed at one other side of the N-type semiconductor layer 20 away from the N-type electrode 10, and the P-type semiconductor 40 is formed at one side of the light-emitting layer 30 away from N-type semiconductor layer 20. The N-type semiconductor layer 20, the light-emitting diode 30 and the P-type semiconductor layer 40 construct a sandwich as a main structure of the LED.

Figure 4:
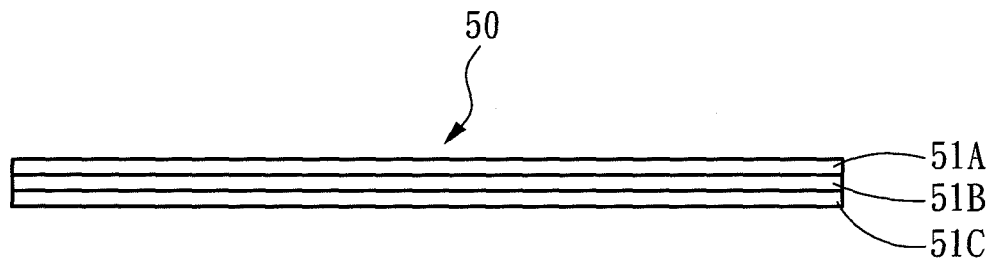
FIG. 4 is a metal mirror layer according to a first embodiment of the present invention.
Figure 5:
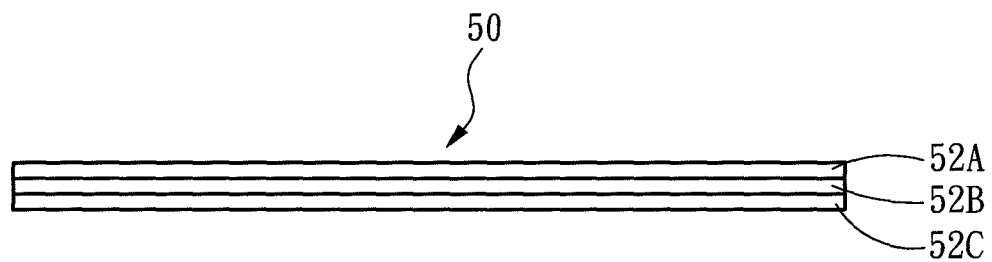
FIG. 5 is a metal mirror layer according to a second embodiment of the present invention.
Figure 6:
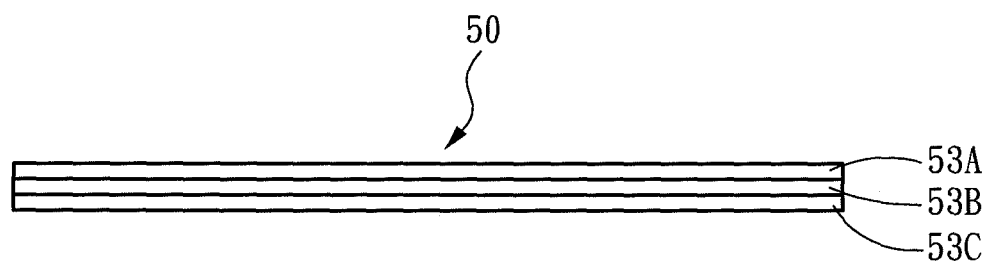
FIG. 6 is a metal mirror layer according to a third embodiment of the present invention.
Figure 7:
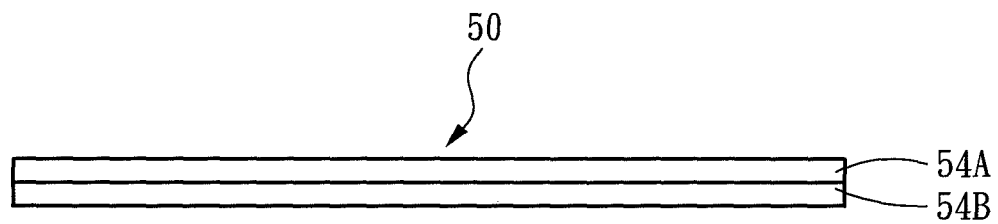
FIG. 7 is a metal mirror layer according to a fourth embodiment of the present invention.

Referring to FIGS. 4, 5, 6 and 7, in one preferred embodiment, the metal mirror layer 50 includes a silver film 51A, a titanium tungsten film 51B, and a platinum film 51C (as shown in FIG. 4), preferably with the thickness of the silver film 51A being 100 to 300 nm, the thickness of the titanium tungsten film 51B being 200 to 300 nm, and the thickness of the platinum film 51C being less than 500 nm. In an alternative preferred embodiment, the metal mirror layer 50 includes a silver film 52A, a titanium film 52B, and a platinum film 52C (as shown in FIG. 5), preferably with the thickness of the silver film 52A being 100 to 300 nm, the thickness of the titanium film 52B being 200 to 300 nm, and the thickness of the platinum film 52C being less than 500 nm. In another alternative preferred embodiment, the metal mirror layer 50 includes a silver film 53A, a titanium film 53B, and a nickel film 53C (as shown in FIG. 6), preferably with the thickness of the silver film 53A being 100 to 300 nm, the thickness of the titanium film 53B being 200 to 300 nm, and the thickness of the nickel film 53C being less than 500 nm. In yet another alternative preferred embodiment, the metal mirror layer 50 includes a silver film 54A and a nickel film 54B (as shown in FIG. 7), preferably with the thickness of the silver film 54A being 100 to 300 nm, and the thickness of the nickel film 54B being less than 2000 nm.

Figure 8:
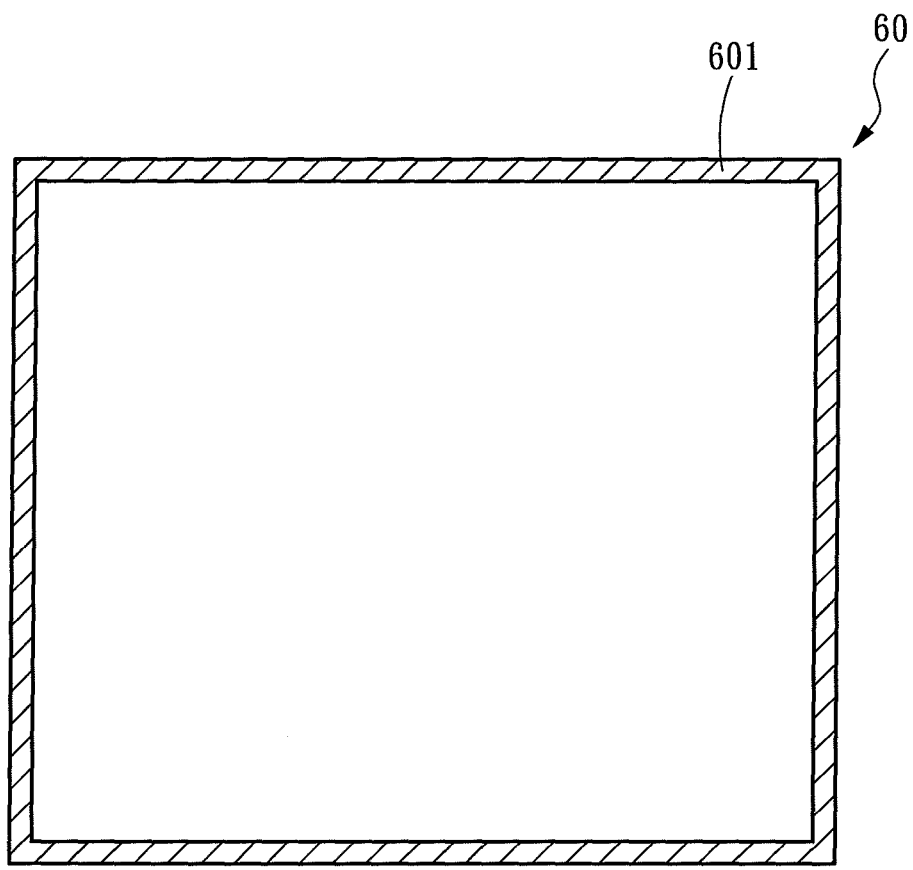
FIG. 8 is a diagram of a pattern of a metal mirror layer according to one embodiment of the present invention.
Figure 9:
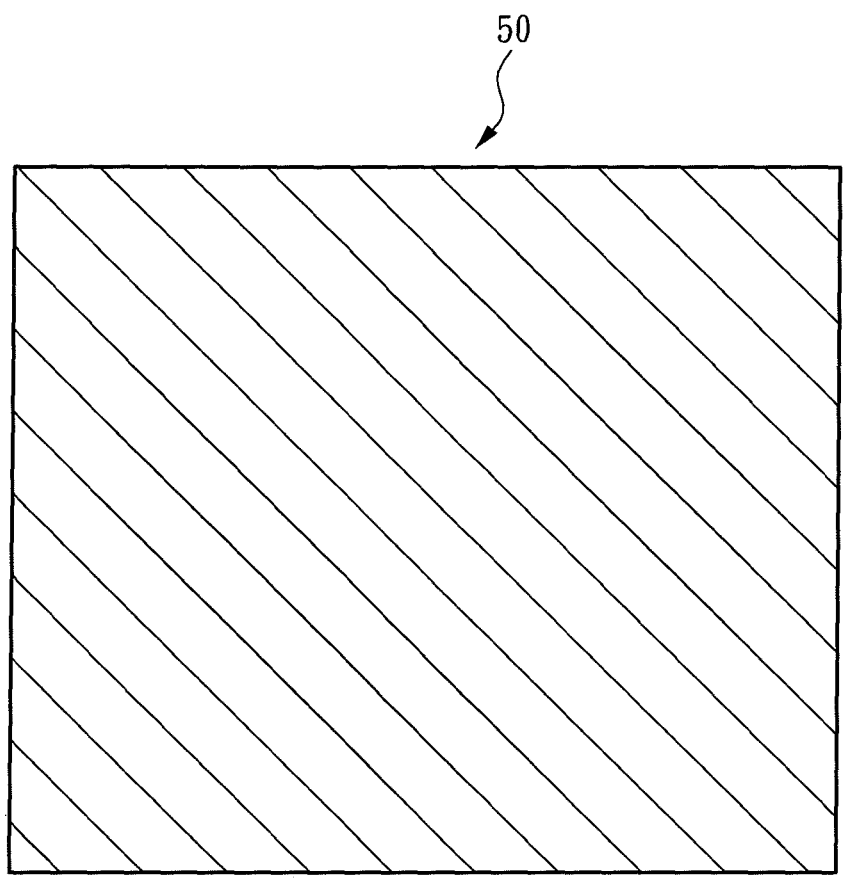
FIG. 9 is a diagram of a pattern of a protection layer according to one embodiment of the present invention.

Also with reference to FIGS. 8 and 9, the present invention includes at least two embodiments. Referring to FIG. 2 showing an embodiment of the present invention, the metal mirror layer 50 is formed at one side of the P-type semiconductor layer 40 away from the light-emitting layer 30, and the protective adhesion layer 61 is formed at one side of the metal mirror layer 50 away from the P-type semiconductor layer 40. The protective adhesion layer 61 is made of a metal or an alloy, and has a hollow frame 601. The hollow frame 601 masks edges of the metal mirror layer 50, and extends inwards by 10 to 50 μm. The protection layer 60 is made of metal oxide, and has the hollow frame 601 same as the protective adhesion layer 61. The buffer layer 70 is formed at one side of the protection layer 60 away from the metal mirror layer 50, and passes through the hollow frame 601 to contact with the metal mirror layer 50.

In one embodiment, the protective adhesion layer 61 is made of a material selected from the group consisting of titanium, tungsten, chromium and combinations thereof. The protection layer 60 is made of a material selected from the group consisting of titanium dioxide, silicon dioxide, aluminum oxide and indium tin oxide that have highly stable physical properties. Further, the protective adhesion layer 61 has a preferred thickness of 10 to 50 nm, and the protection layer 60 has a preferred thickness of 50 to 200 nm. Moreover, the buffer layer 70 is made of a conductive and stable metal having a thermal expansion coefficient between those of gallium nitride (GaN) and silicon, e.g., titanium, platinum, titanium tungsten and nickel, so as to serve as a buffer between a silicon substrate and a GaN epitaxial layer.

FIG. 3 shows another embodiment of the present invention. In this embodiment, the same materials may be adopted, with a main difference being that, the protective adhesion layer 61 is formed at one side of the P-type semiconductor layer 40 away from the light-emitting layer 30 and has a hollow frame 601. The protection layer 60 is formed at one side of the protective adhesion layer 61 away from the P-type semiconductor layer 40. The protection layer 60 is made of metal oxide, and has the hollow frame 601. The metal mirror layer 50 passes through the frame 601 to form at one side of the P-type semiconductor layer 40 away from the light-emitting layer 30, so as to allow the hollow frame 601 of the protective adhesion layer 61 and the protection layer 60 to support edges of the metal mirror layer 50. Further, the metal mirror layer 50 extends from edges of the protection layer 60 towards a center thereof by 10 to 50 μm. The buffer layer 70 is formed at one side of the metal mirror layer 50 away from the protection layer 50. At the edges of the metal mirror layer 50, the buffer layer 70 jointly encases the metal mirror layer 50 with the protective adhesion layer 61 and the protection layer 60.

Figure 10:
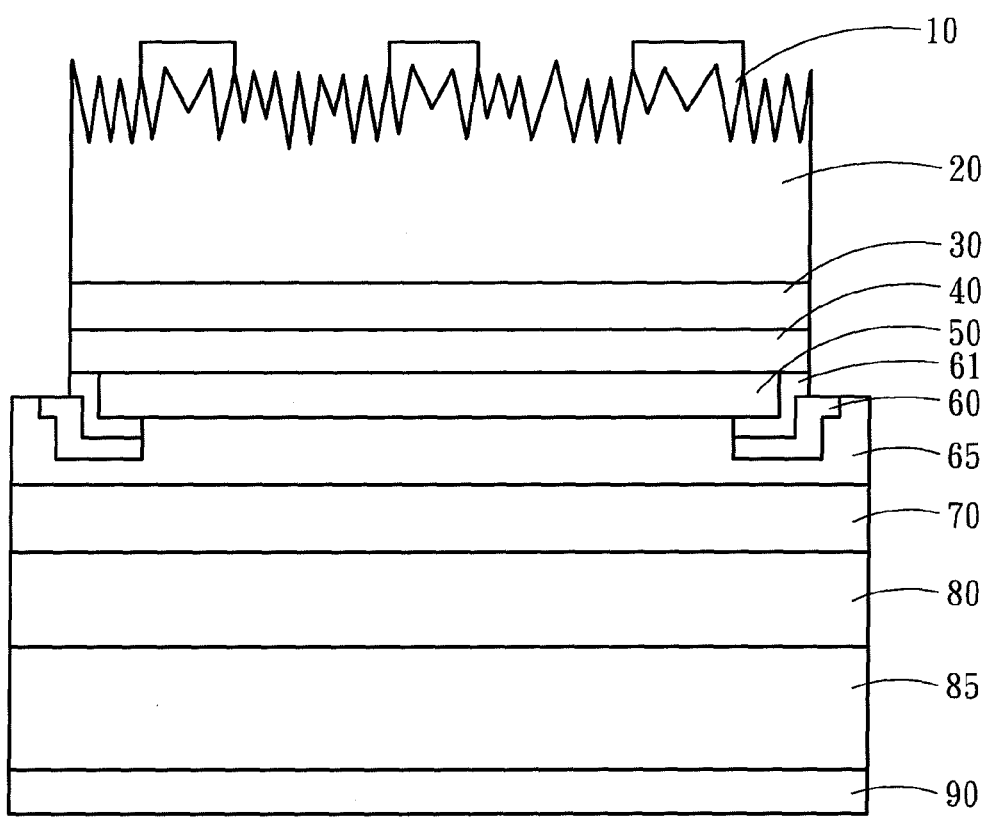
FIG. 10 is a structural diagram of an LED comprising a conduction layer according to one embodiment of the present invention.
Figure 11:
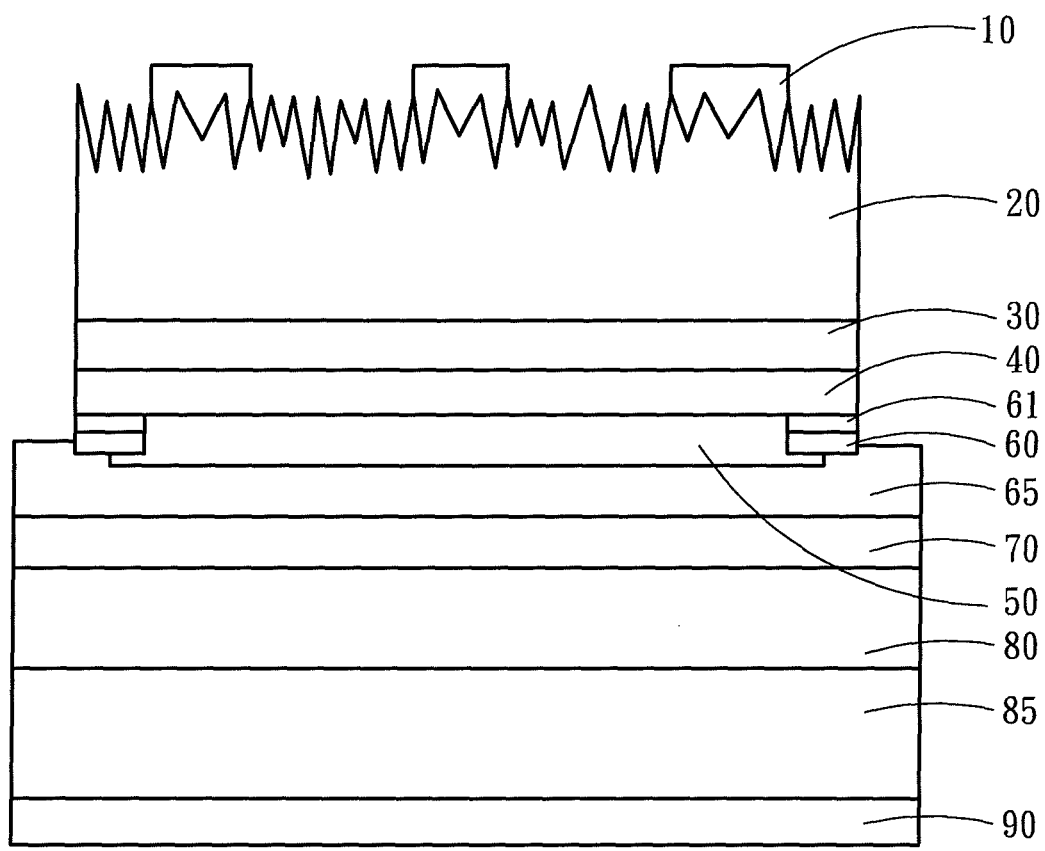
FIG. 11 is a structural diagram of an LED comprising a conduction layer according to another embodiment of the present invention.

Referring to FIGS. 10 and 11, in the two embodiments above, a conduction layer 65 is further provided between the protection layer 60 and the buffer layer 70. For example, the conduction layer 65 is made of a high-conductivity metal such as gold and chromium. The conduction layer 65 also passes through the frame 601 to contact with the metal mirror layer 50 to prevent contact impedance from exceeding.

Further, the binding layer 80 is formed at one side of the buffer layer 70 away from the protection layer 60, the permanent substrate 85 is formed at one side of the binding layer 80 away from the protection layer 60, and the P-type electrode 90 is formed at one side of the permanent substrate 85 away from the binding layer 80. The binding layer 80 is for engaging the permanent substrate 85 and the buffer layer 70, and the permanent substrate 85 is a common conductive silicon substrate.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A light-emitting diode (LED) with a mirror protection layer, comprising:
    an N-type electrode;
    an N-type semiconductor layer, the N-type electrode being formed at one side of the N-type semiconductor layer;
    a light-emitting layer formed at one side of the N-type semiconductor layer away from the N-type electrode;
    a P-type semiconductor layer formed at one side of the light-emitting layer away from the N-type semiconductor layer;
    a metal mirror layer formed at one side of the P-type semiconductor layer away from the light-emitting layer;
    a protective adhesion layer which is formed at one side of the metal mirror layer away from the P-type semiconductor layer and includes a hollow frame which masks edges of the metal mirror layer and extends inwards by 10 to 50 μm;
    a protection layer formed at one side of the protective adhesion layer away from the P-type semiconductor layer and made of metal oxide, the protection layer including the hollow frame same as the protective adhesion layer;
    a buffer layer which is formed at one side of the protection layer away from the metal mirror layer and passes through the frame to contact with the metal mirror layer;
    a binding layer formed at one side of the buffer layer away from the protection layer;
    a permanent substrate formed at one side of the binding layer away from the protection layer; and
    a P-type electrode formed at one side of the permanent substrate away from the binding layer.

2. The LED of claim 1, wherein the metal mirror layer includes a silver film, a titanium tungsten film and a platinum film.

3. The LED of claim 2, wherein the silver film has a thickness of 100 to 300 nm, the titanium tungsten film has a thickness of 200 to 300 nm, and the platinum film has a thickness of less than 500 nm.

4. The LED of claim 1, wherein the metal mirror layer includes a silver film, a titanium film and a platinum film.

5. The LED of claim 4, wherein the silver film has a thickness of 100 to 300 nm, the titanium film has a thickness of 200 to 300 nm, and the platinum film has a thickness of less than 500 nm.

6. The LED of claim 1, wherein the metal mirror layer includes a silver film, a titanium film and a nickel film.

7. The LED of claim 6, wherein the silver film has a thickness of 100 to 300 nm, the titanium film has a thickness of 200 to 300 nm, and the nickel film has a thickness of less than 500 nm.

8. The LED of claim 1, wherein the metal mirror layer includes a silver film and a nickel film.

9. The LED of claim 8, wherein the silver film has a thickness of 100 to 300 nm, and the nickel film has a thickness of less than 2000 nm.

10. The LED of claim 1, wherein the protective adhesion layer is made of a material selected from the group consisting of titanium, tungsten, chromium and combinations thereof, and the protection layer is made of a material selected from the group consisting of indium tin oxide, titanium dioxide, silicon dioxide and aluminum oxide.

11. The LED of claim 10, wherein the protective adhesion layer has a thickness of 10 to 50 nm, and the protection layer has a thickness of 50 to 200 nm.

12. The LED of claim 1, wherein a conduction layer is provided between the protection layer and the buffer layer, and the conduction layer passes through the frame to contact with the metal mirror layer.

13. A light-emitting diode (LED) with a mirror protection layer, comprising:
    an N-type electrode;
    an N-type semiconductor layer, the N-type electrode being formed at one side of the N-type semiconductor layer;
    a light-emitting layer formed at one side of the N-type semiconductor layer away from the N-type electrode;
    a P-type semiconductor layer formed at one side of the light-emitting layer away from the N-type semiconductor layer;
    a protective adhesion layer which is formed at one side of the P-type semiconductor layer away from the light-emitting layer and includes a hollow frame;
    a protection layer which is formed at one side of the protective adhesion layer away from the P-type semiconductor layer and made of metal oxide, the protection layer including the hollow frame same as the protective adhesion layer;
    a metal mirror layer passing through the frame to form at one side of the P-type semiconductor layer away from the light-emitting layer, such that the frame of the protective adhesion layer and the protection layer support edges of the metal mirror layer, the metal mirror layer extending from edges of the protection layer towards a center thereof by 10 to 50 μm;
    a buffer layer which is formed at one side of the metal mirror layer away from the protection layer and jointly encases the metal mirror layer with the protective adhesion layer and the protection layer at the edges of the metal mirror layer;
    a binding layer formed at one side of the buffer layer away from the protection layer;
    a permanent substrate formed at one side of the binding layer away from the protection layer; and
    a P-type electrode formed at one side of the permanent substrate away from the binding layer.

14. The LED of claim 13, wherein the metal mirror layer includes a silver film, a titanium tungsten film and a platinum film.

15. The LED of claim 14, wherein the silver film has a thickness of 100 to 300 nm, the titanium tungsten film has a thickness of 200 to 300 nm, and the platinum film has a thickness of less than 500 nm.

16. The LED of claim 13, wherein the metal mirror layer includes a silver film, a titanium film and a platinum film.

17. The LED of claim 16, wherein the silver film has a thickness of 100 to 300 nm, the titanium film has a thickness of 200 to 300 nm, and the platinum film has a thickness of less than 500 nm.

18. The LED of claim 13, wherein the metal mirror layer includes a silver film, a titanium film and a nickel film.

19. The LED of claim 18, wherein the silver film has a thickness of 100 to 300 nm, the titanium film has a thickness of 200 to 300 nm, and the nickel film has a thickness of less than 500 nm.

20. The LED of claim 13, wherein the metal mirror layer includes a silver film and a nickel film.

21. The LED of claim 20, wherein the silver film has a thickness of 100 to 300 nm, and the nickel film has a thickness of less than 2000 nm.

22. The LED of claim 13, wherein the protective adhesion layer is made of a material selected from the group consisting of titanium, tungsten, chromium and combinations thereof, and the protection layer is made of a material selected from the group consisting of indium tin oxide, titanium dioxide, silicon dioxide and aluminum oxide.

23. The LED of claim 22, wherein the protective adhesion layer has a thickness of 10 to 50 nm, and the protection layer has a thickness of 50 to 200 nm.

24. The LED of claim 13, wherein a conduction layer is provided between the protection layer and the buffer layer, and the conduction layer passes through the frame to contact with the metal mirror layer.

* * * * *